US008534628B2

(12) United States Patent
Lu

(10) Patent No.: US 8,534,628 B2
(45) Date of Patent: Sep. 17, 2013

(54) MOUNTING APPARATUS FOR MOTHERBOARD

(75) Inventor: Hung-Chun Lu, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 62 days.

(21) Appl. No.: 13/237,950

(22) Filed: Sep. 21, 2011

(65) Prior Publication Data

US 2013/0009026 A1 Jan. 10, 2013

(30) Foreign Application Priority Data

Jul. 8, 2011 (TW) .............................. 100124356 A

(51) Int. Cl.
| | | |
|---|---|---|
| H05K 7/14 | (2006.01) | |
| H05K 7/18 | (2006.01) | |
| H05K 1/14 | (2006.01) | |
| H05K 5/00 | (2006.01) | |
| H05K 7/00 | (2006.01) | |
| H05K 7/16 | (2006.01) | |
| A47F 5/00 | (2006.01) | |

(52) U.S. Cl.
USPC ........ 248/309.1; 361/801; 361/740; 361/759; 361/747; 361/726; 361/679.58; 361/679.02; 361/752; 361/753

(58) Field of Classification Search
USPC .............. 248/309.1; 361/801, 372, 740, 759, 361/747, 726, 807–810, 679.58, 679.02, 361/752, 753
See application file for complete search history.

(56) References Cited

U.S. PATENT DOCUMENTS

| | | | | |
|---|---|---|---|---|
| 5,692,208 | A * | 11/1997 | Felcman et al. | ......... 361/679.38 |
| 6,118,668 | A * | 9/2000 | Scholder et al. | .............. 361/753 |
| 6,186,800 | B1 * | 2/2001 | Klein et al. | ..................... 439/95 |
| 6,362,975 | B1 * | 3/2002 | Liu et al. | ....................... 361/796 |
| 6,816,388 | B2 * | 11/2004 | Junkins et al. | ............... 361/801 |
| 6,937,476 | B1 * | 8/2005 | Chen et al. | .................... 361/756 |
| 7,110,264 | B2 * | 9/2006 | Chen et al. | .................... 361/801 |
| 7,120,032 | B2 * | 10/2006 | Lin et al. | ....................... 361/801 |
| 7,265,996 | B2 * | 9/2007 | Fan et al. | ....................... 361/801 |
| 7,330,358 | B2 * | 2/2008 | Chen et al. | .................... 361/810 |
| 7,342,808 | B2 * | 3/2008 | Chen et al. | .................... 361/801 |
| 7,535,730 | B2 * | 5/2009 | Junkins et al. | ............... 361/801 |
| 7,826,221 | B2 * | 11/2010 | Yeh et al. | ................. 361/679.58 |
| 7,876,569 | B2 * | 1/2011 | Xue | ............................. 361/759 |
| 8,031,465 | B2 * | 10/2011 | Chen et al. | ............. 361/679.54 |
| 8,223,501 | B2 * | 7/2012 | Wu et al. | ....................... 361/740 |
| 8,248,817 | B2 * | 8/2012 | Yeh et al. | ....................... 361/801 |
| 2005/0168927 | A1 * | 8/2005 | Chen et al. | .................... 361/683 |
| 2005/0168959 | A1 * | 8/2005 | Chen et al. | .................... 361/752 |

(Continued)

*Primary Examiner* — Terrell McKinnon
*Assistant Examiner* — Christopher Garft
(74) *Attorney, Agent, or Firm* — Altis Law Group, Inc.

(57) ABSTRACT

A mounting apparatus for a motherboard includes a chassis, a bracket, a resilient plate, and a handle. The chassis includes a sidewall, and a fastener formed on an inner surface of the sidewall. The bracket is fixed to a side of the motherboard. The resilient plate includes a fixing portion fixed to a side of the bracket facing the sidewall, a connecting portion slantingly extending toward the sidewall from the fixing portion, and a resilient arm extending from the connecting portion away from the fixing portion and defining a latching hole. The handle is pivotably connected to the bracket and includes a first plate. When the handle is rotated towards the bracket, the first plate is inserted into a space between the resilient arm and the bracket, and deforms the resilient arm towards the sidewall. The fastener engages in the latching hole of the resilient arm.

13 Claims, 5 Drawing Sheets

(56) References Cited

U.S. PATENT DOCUMENTS

| | | | |
|---|---|---|---|
| 2005/0185388 A1* | 8/2005 | Chen et al. | 361/801 |
| 2005/0276007 A1* | 12/2005 | Fan et al. | 361/683 |
| 2010/0002378 A1* | 1/2010 | Chen et al. | 361/679.58 |
| 2010/0097756 A1* | 4/2010 | Yeh et al. | 361/679.58 |
| 2011/0114808 A1* | 5/2011 | Huang et al. | 248/305 |
| 2011/0122588 A1* | 5/2011 | Wu et al. | 361/759 |
| 2011/0290972 A1* | 12/2011 | Chen et al. | 248/309.1 |
| 2013/0003338 A1* | 1/2013 | Lu | 361/807 |

\* cited by examiner

MOUNTING APPARATUS FOR MOTHERBOARD

BACKGROUND

1. Technical Field

The present disclosure relates to an apparatus for mounting a motherboard.

2. Description of Related Art

Typically, a motherboard is mounted to a chassis of a computer through screws. However, these screws are usually small and difficult to handle, and the installation and disassembly of the motherboard in the computer is labor-intensive.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawing, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
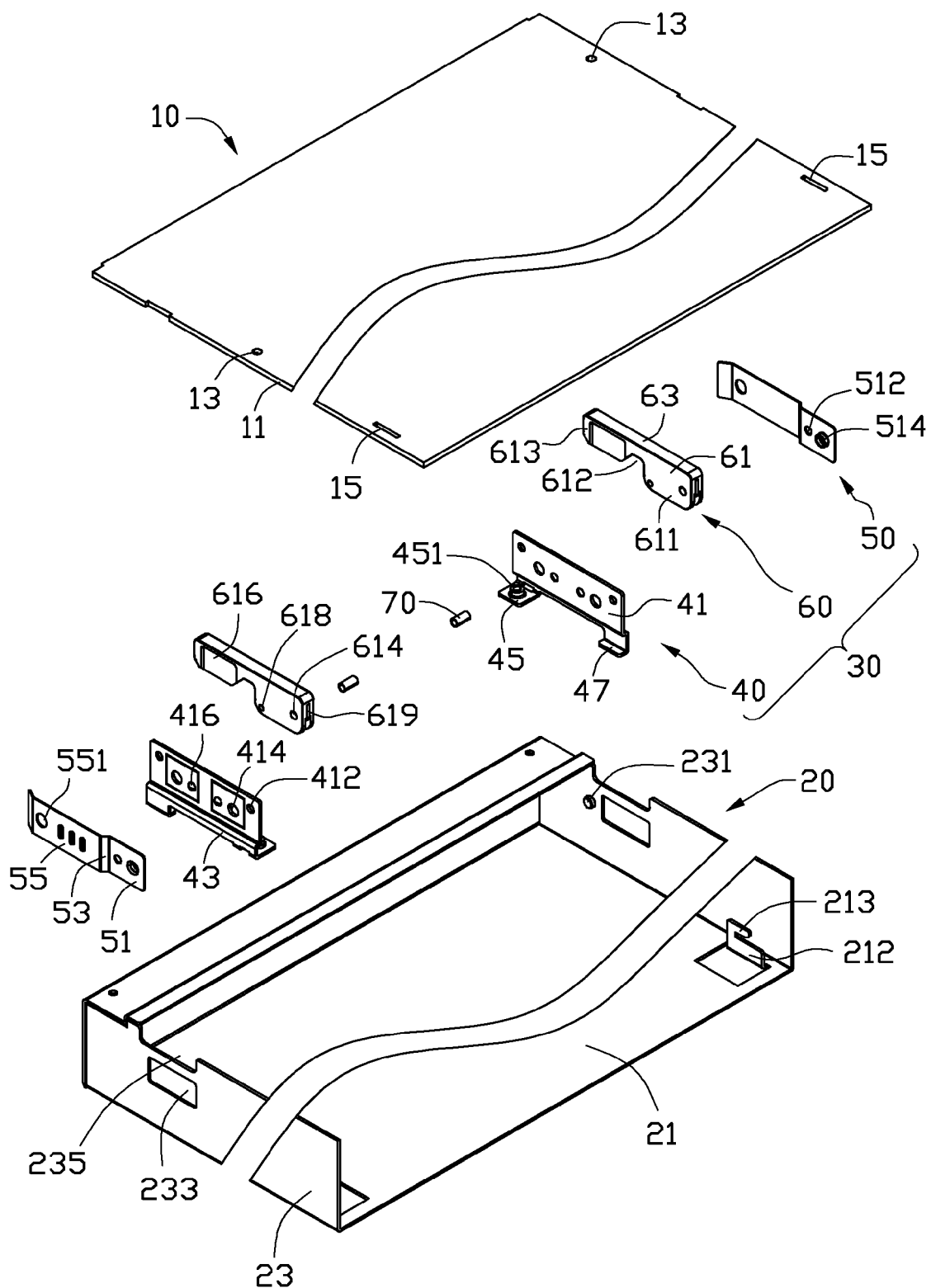
FIG. 1 is an exploded, isometric view of an exemplary embodiment of a mounting apparatus together with a motherboard, wherein the mounting apparatus includes two fixing devices.

Referring to FIG. 1, an exemplary embodiment of a mounting apparatus is provided to mount a motherboard 10. The mounting apparatus includes a chassis 20, and two opposite fixing devices 30.

The motherboard 10 includes two opposite sides 11. A through hole 13 and a slot 15 are defined in the motherboard 10 adjacent to each side 11. The through holes 13 are arranged adjacent to a first end of the motherboard 10, and the slots 15 are arranged adjacent to a second end of the motherboard 10 away from the first end.

The chassis 20 includes a bottom wall 21, and two sidewalls 23 perpendicularly extending up from opposite sides of the bottom wall 21, respectively. Two tabs 212 extend up from the bottom wall 21, adjacent to the sidewalls 23, respectively. Each tab 212 is parallel to the sidewalls 23, and forms a hook 213 on a first end of the top of the tab 212. The hook 213 extends toward a second end of the top of the tab 212 away from the first end. Two fasteners 231 respectively protrude from inner surfaces of the sidewalls 23, away from the tabs 212. An opening 233 is defined in each sidewall 23 adjacent to the corresponding fastener 231. A notch 235 is defined in the top of each sidewall 23 above the corresponding opening 233.

Each fixing device 30 includes a bracket 40, a resilient plate 50, a handle 60, and a pin 70. In the embodiment, the pin 70 is a spring pin.

The bracket 40 includes a rectangular main body 41, a bending portion 43 extending out and down from the bottom of the main body 41, a fixing plate 45 perpendicularly extending in from a first end the bottom of the bending portion 43, and a supporting plate 47 extending down and in from a second end of the bottom of the bending portion 43 away from the fixing plate 45. Two fixing holes 414 are defined in the main body 41 adjacent to opposite ends of the main body 41, respectively. Two pivot holes 412 are defined in the main body 41 adjacent to two top corners of the main body 41, respectively. Two protrusions 416 are formed on an outer surface of the main body 41, between the fixing holes 414. A post 451 defining a threaded hole is formed on a middle of the fixing plate 45.

The resilient plate 50 is stamped out of sheet metal, and includes a fixing portion 51, a connecting portion 53 slantingly extending outwards from an end of the fixing portion 51, and a resilient arm 55 slantingly concaving inwards from an end of the connecting portion 53 away from the fixing portion 51. A through hole 512 is defined in the fixing portion 51 adjacent to the connecting portion 53. A projection 514 perpendicularly extends from an inner surface of the fixing portion 51 away from the connecting portion 53. A latching hole 551 is defined in the resilient arm 55 away from the connecting portion 53.

The handle 60 includes two opposite side plates 61, and a top plate 63 connected between tops of the side plates 61. Each side plate 61 includes a first plate 613, a second plate 611, and a slot 612 defined between the first and second plates 613 and 611. The bottom end of each slot 612 extends through the bottom of the corresponding side plate 61. Each second plate 611 defines a pivot hole 614 away from the corresponding slot 612, and a positioning hole 618 adjacent to the corresponding slot 612. A block 619 extends from an inner surface of each second plate 611 towards the opposite second plate 611 adjacent to the corresponding pivot hole 614. A concave portion 616 is formed on an outer surface of each first plate 613.

Figure 2:
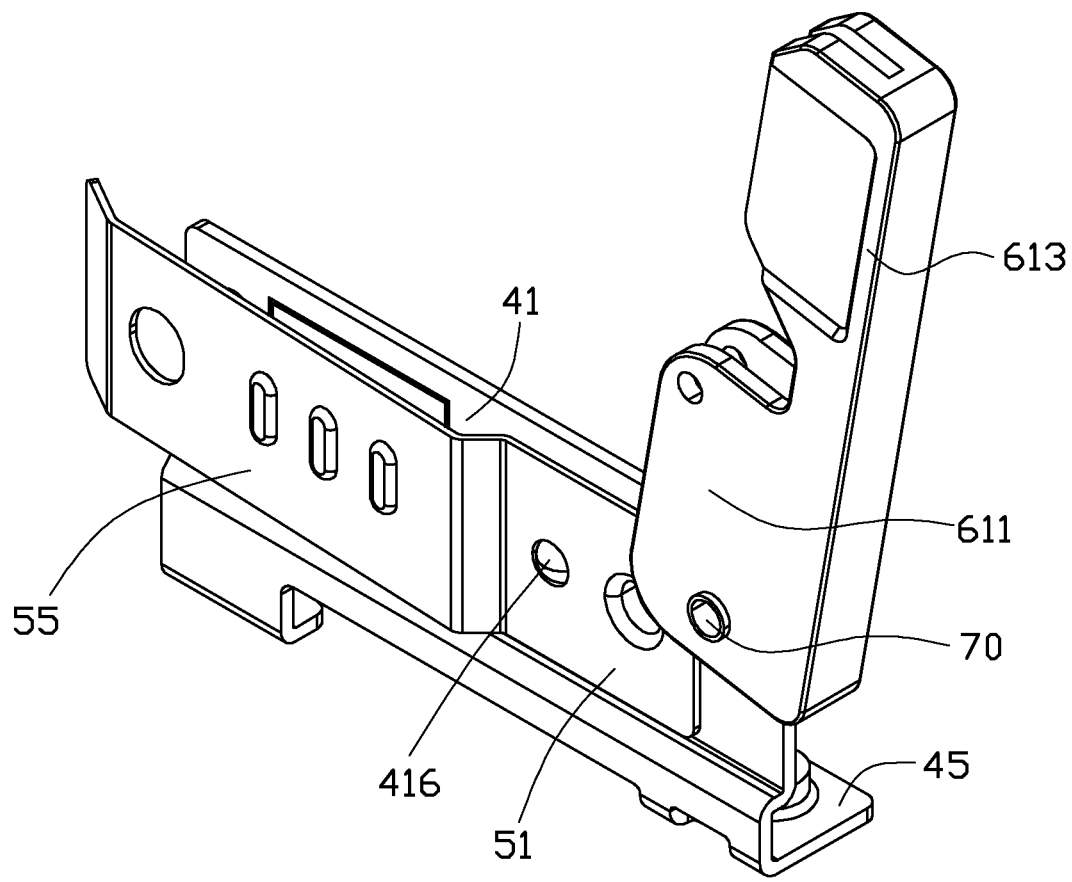
FIG. 2 is an assembled, enlarged view of one of the fixing devices of FIG. 1.

Referring to FIGS. 1 and 2, to assemble the fixing devices 30, the resilient plates 50 are respectively arranged at the outer sides of the brackets 40. The projection 514 of one of the resilient plate 50 is extended through the fixing hole 414 of one of the corresponding brackets 40 adjacent to the fixing plate 45, and is riveted to the corresponding bracket 40. The projection 514 of the other resilient plate 50 is extended through the fixing hole 414 of the other bracket 40 adjacent to the supporting plate 47, and is riveted to the other bracket 40. Thereby, the fixing portions 51 of the resilient plates 50 are fixed to the outer sides of the brackets 40, respectively. The protrusions 416 of each bracket 40 adjacent to the corresponding projection 514 is extended through the through hole 512 of the corresponding resilient plate 50, and exposed out of the corresponding resilient plate 50. Each resilient arm 55 gradually approaches the main body 41 of the corresponding bracket 40 from an end adjacent to the corresponding connecting portion 53 to an opposite end away from the corresponding connecting portion 53.

The top corner of each main body 41 adjacent to the corresponding projection 514 is inserted into a space between the blocks 619 of the corresponding handle 60, to allow the pivot hole 412 adjacent to the projection 514 to align with the pivot holes 614 of the corresponding handle 60. A pin 70 is extended through the pivot holes 614 and 412 of the handle 60 and bracket 40 of each fixing device 30, to rotatably connect the handle 60 to the bracket 40.

Figure 4:
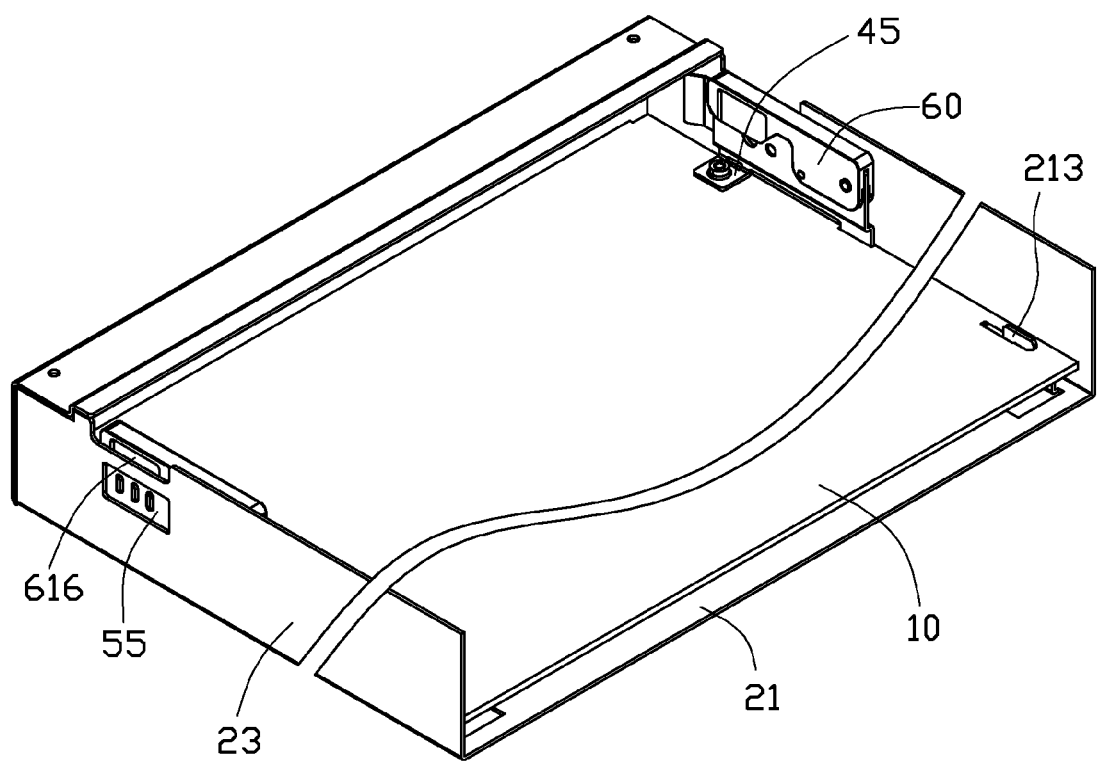
FIG. 4 is an assembled, isometric view of FIG. 1, wherein the motherboard is locked.

Referring to FIG. 4, to assemble the motherboard 10, the fixing devices 30 are oppositely arranged, to allow each of the opposite sides 11 of the motherboard 10 to be sandwiched between the supporting plate 47 and the fixing plate 45 of the corresponding bracket 40, and to allow the through holes 13 of the motherboard 10 to align with bottoms of the threaded holes of the posts 451 of the brackets 40, respectively. Two screws (not shown) are respectively extended through the through holes 13, and engage in the corresponding threaded holes of the posts 451, to fix the opposite sides 11 of the motherboard 10 to the fixing plates 45 of the brackets 40, respectively. The motherboard 10 and the fixing devices 30 are placed in the chassis 20. The hooks 213 are extended through the corresponding slots 15 of the motherboard 10, to allow the motherboard 10 to be supported on the tabs 212. The motherboard 10 is slid towards the first ends of the tabs 212, until the motherboard 10 is stopped by the hooks 213. The hooks 213 engage with the top of the motherboard 10. The latching holes 551 of the resilient plates 50 of the fixing devices 30 align with the fasteners 231 of the sidewalls 23 of the chassis 20, respectively.

Figure 3:
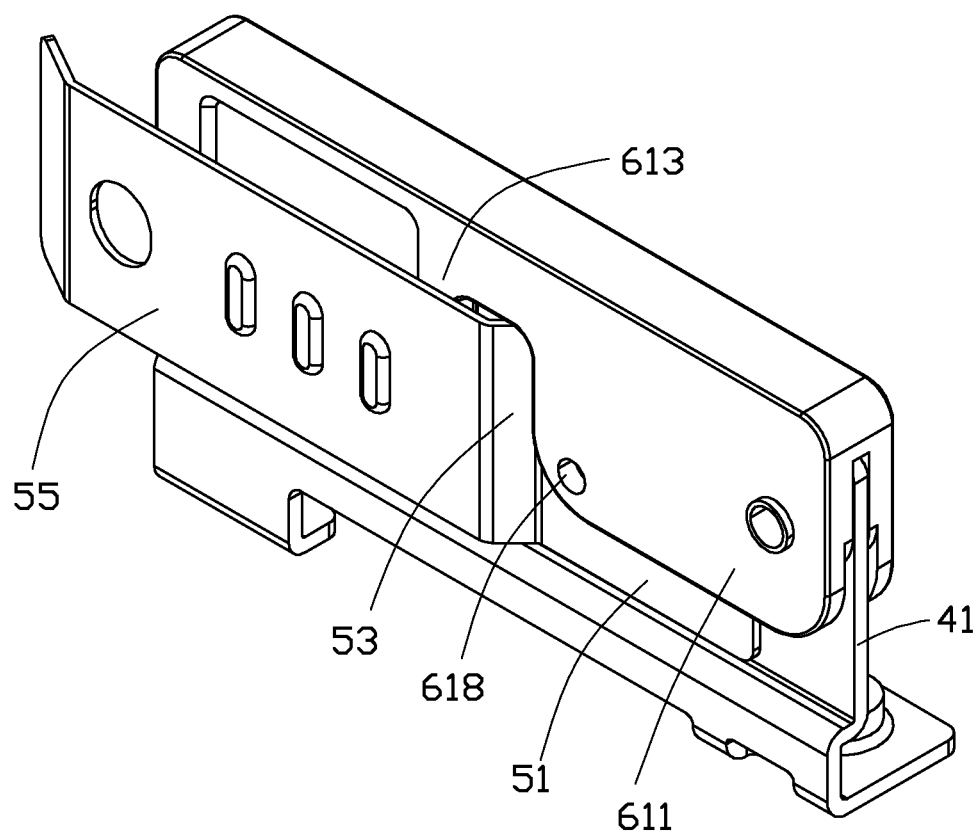
FIG. 3 is similar to FIG. 2, but shows the fixing device in a different state.

Referring to FIGS. 3 and 4, the handles 60 are rotated towards the corresponding brackets 40. To each fixing device 30, the fixing portion 51 of the resilient plate 50 and a first end of the corresponding bracket 40 connected to the fixing portion 51 are inserted into a space between the second plates 611 of the corresponding handle 60, the connecting portion 53 of the resilient plate 50 is inserted into the slot 612 on an outer side of the corresponding handle 60, and the first plate 613 on the outer side of the handle 60 is inserted into a space between the bracket 40 and the resilient arm 55 of the resilient plate 50. The resilient arm 55 of each resilient plate 50 is deformed towards the corresponding sidewall 23 by the corresponding first plate 613. The fastener 231 of each sidewall 23 engages in the latching hole 551 of the corresponding resilient arm 55. Thereby, the fixing devices 30 and the motherboard 10 are fixed to the sidewalls 23 of the chassis 20. A second end of each bracket 40 aligning with the corresponding resilient arm 55 is inserted into a space between the first plates 613 of the corresponding handle 60. The protrusion 416 of each bracket 40 engages in the positioning hole 618 of the second plate 611 on an outer side of the corresponding handle 60, to lock the handle 60 to the corresponding bracket 40. The concave portion 616 on an outer side of each handle 60 is aligned with the notch 235 of the corresponding sidewall 23. The resilient arm 55 of each resilient plate 50 is aligned with the opening 233 of the corresponding sidewall 23.

Figure 5:
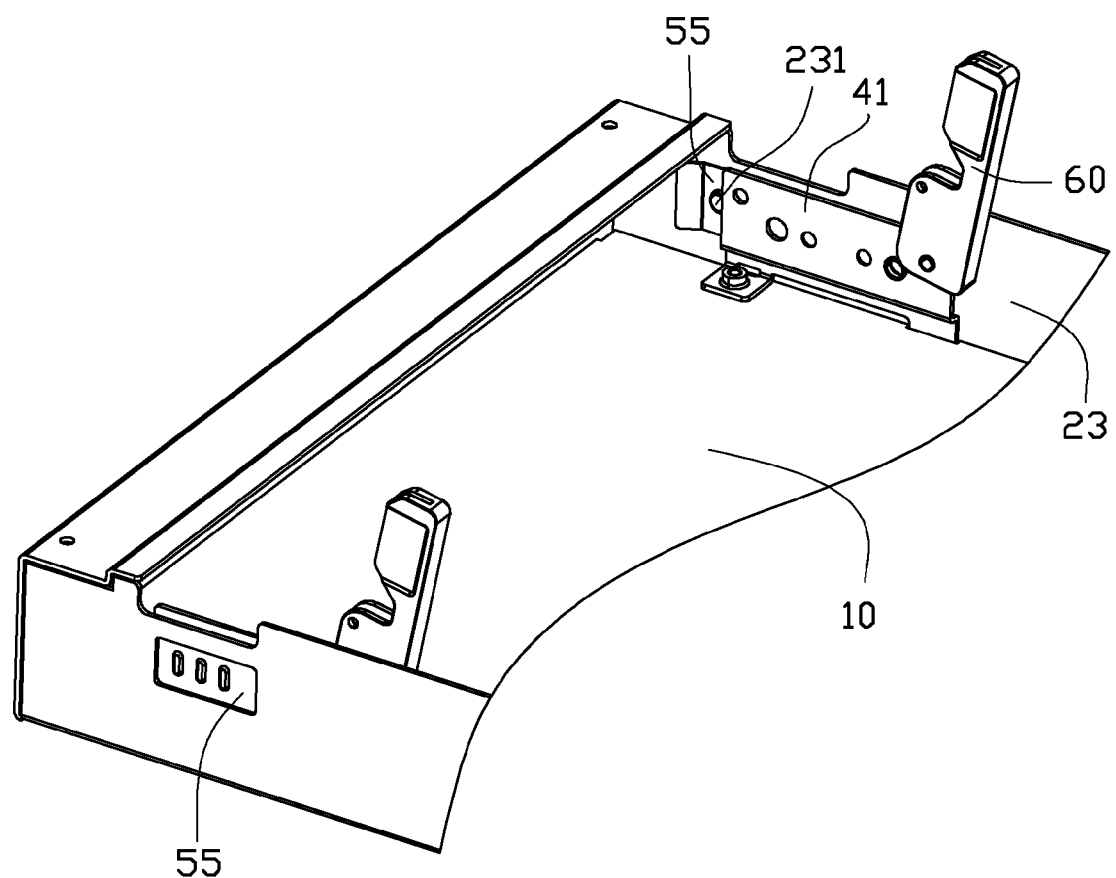
FIG. 5 is similar to FIG. 4, but the motherboard is unlocked.

Referring to FIG. 5, to detach the motherboard 10 from the chassis 20, an operator inserts fingers into the notches 235 of the sidewalls 23 and operates the concave portions 616 of the handles 60, to rotate the handles 60 upwards. The protrusions 416 of the brackets 40 disengage from the positioning holes 618 of the corresponding handles 60. The operator inserts fingers into the openings 233 of the sidewalls 23 and presses the resilient arms 55 towards the corresponding brackets 40, to allow the resilient arms 55 to disengage from the fasteners 231 of the corresponding sidewalls 23. The resilient arms 55 are restored inwards. The motherboard 10 is slid to disengage from the hooks 213 of the chassis 20. Thereby, the motherboard 10 and the fixing devices 30 can be detached from the chassis 20, and the motherboard 10 is ready to be detached from the fixing devices 30.

Even though numerous characteristics and advantages of the embodiments have been set forth in the foregoing description, together with details of the structure and the functions of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A mounting apparatus for a motherboard, comprising:
   a chassis comprising a sidewall, and a fastener formed on an inner surface of the sidewall;
   a bracket to be fixed to a side of the motherboard;
   a resilient plate comprising a fixing portion fixed to a side of the bracket facing the sidewall, a connecting portion slantingly extending toward the sidewall from the fixing portion, and a resilient arm extending from an end of the connecting portion away from the fixing portion, wherein a latching hole is defined in the resilient arm aligning with the fastener; and
   a handle pivotably connected to the bracket and comprising a first plate, wherein when the handle is rotated towards the bracket, the first plate is inserted into a space between the resilient arm and the bracket, and deforms the resilient arm towards the sidewall, the fastener of the sidewall engages in the latching hole of the resilient arm;
   wherein the bracket comprises a main body parallel to the sidewall, and a fixing plate extending away from the sidewall from a bottom of the main body, to be fixed to the side of the motherboard; and
   wherein the bracket further comprises a supporting plate extending away from the sidewall from the bottom of the main body, the motherboard is sandwiched between the supporting plate and the fixing plate.

2. The mounting apparatus of claim 1, wherein a positioning hole is defined in the handle, and a protrusion is formed on the bracket, when the handle is rotated towards the bracket, the protrusion engages in the positioning hole of the handle.

3. The mounting apparatus of claim 1, wherein the handle comprises a first side plate facing the sidewall, a second side plate opposite to the first side plate, and a top plate connected between tops of the first and second side plates, the first plate is formed on the first side plate.

4. The mounting apparatus of claim 3, wherein the first side plate further comprises a second plate, and a slot defined between the first and second plates, the bottom end of the slot extends through the bottom of the first side plate, when the handle is rotated towards the bracket, the connecting portion of the resilient plate is inserted into the slot, the fixing portion of the resilient plate and a first end of the bracket connected to the fixing portion are sandwiched between the second plate and the second side plate, a second end of the bracket aligning with the resilient arm is sandwiched between the first plate and the second side plate.

5. The mounting apparatus of claim 1, wherein the resilient plate is stamped out of sheet metal.

6. The mounting apparatus of claim 1, wherein the resilient arm slantingly extends toward the bracket from an end adjacent to the connecting portion to an opposite end away from the connecting portion.

7. The mounting apparatus of claim 1, wherein a fixing hole is defined in the bracket, a projection extends from a side of the fixing portion of the resilient plate away from the sidewall, the projection is extended through the fixing hole and riveted to the bracket.

8. The mounting apparatus of claim 5, wherein a first pivot hole is defined in the bracket adjacent to the fixing hole, a second pivot hole is defined in an end of the handle, a pin is extended through the first and second pivot holes, to pivotably connect the handle to the bracket.

9. The mounting apparatus of claim 1, wherein an opening is defined in the sidewall aligning with the resilient arm of the resilient plate.

10. The mounting apparatus of claim 9, wherein a notch is defined in the top of the sidewall above the opening, the top of the handle is exposed out of the notch when the handle is rotated toward the bracket.

11. The mounting apparatus of claim 1, wherein the chassis further comprises a bottom wall perpendicularly connected to a bottom of the sidewall, a tab extends up from the bottom wall adjacent to the sidewall to support the motherboard, and a hook is formed on the top of the tab, to extend through a slot defined in the motherboard and engage with a top of the motherboard.

12. A mounting apparatus for a motherboard, comprising:
a chassis comprising a sidewall, and a fastener formed on an inner surface of the sidewall;
a bracket to be fixed to a side of the motherboard;
a resilient plate comprising a fixing portion fixed to a side of the bracket facing the sidewall, a connecting portion slantingly extending toward the sidewall from the fixing portion, and a resilient arm extending from an end of the connecting portion away from the fixing portion, wherein a latching hole is defined in the resilient arm aligning with the fastener; and
a handle pivotably connected to the bracket and comprising a first plate, wherein when the handle is rotated towards the bracket, the first plate is inserted into a space between the resilient arm and the bracket, and deforms the resilient arm towards the sidewall, the fastener of the sidewall engages in the latching hole of the resilient arm;
wherein the handle comprises a first side plate facing the sidewall, a second side plate opposite to the first side plate, and a top plate connected between tops of the first and second side plates, the first plate is formed on the first side plate; and
wherein the first side plate further comprises a second plate, and a slot defined between the first and second plates, the bottom end of the slot extends through the bottom of the first side plate, when the handle is rotated towards the bracket, the connecting portion of the resilient plate is inserted into the slot, the fixing portion of the resilient plate and a first end of the bracket connected to the fixing portion are sandwiched between the second plate and the second side plate, a second end of the bracket aligning with the resilient arm is sandwiched between the first plate and the second side plate.

13. A mounting apparatus for a motherboard, comprising:
a chassis comprising a sidewall, and a fastener formed on an inner surface of the sidewall;
a bracket to be fixed to a side of the motherboard;
a resilient plate comprising a fixing portion fixed to a side of the bracket facing the sidewall, a connecting portion slantingly extending toward the sidewall from the fixing portion, and a resilient arm extending from an end of the connecting portion away from the fixing portion, wherein a latching hole is defined in the resilient arm aligning with the fastener; and
a handle pivotably connected to the bracket and comprising a first plate, wherein when the handle is rotated towards the bracket, the first plate is inserted into a space between the resilient arm and the bracket, and deforms the resilient arm towards the sidewall, the fastener of the sidewall engages in the latching hole of the resilient arm;
wherein a fixing hole is defined in the bracket, a projection extends from a side of the fixing portion of the resilient plate away from the sidewall, the projection is extended through the fixing hole and riveted to the bracket.

* * * * *